United States Patent [19]

Braddock

[11] 3,909,703

[45] Sept. 30, 1975

[54] LOW POWER GATE SWITCHING DEVICE FOR TRIACS

[75] Inventor: Walter B. Braddock, San Jose, Calif.

[73] Assignee: American Microsystems, Inc., Santa Clara, Calif.

[22] Filed: July 17, 1974

[21] Appl. No.: 489,398

[52] U.S. Cl. .................. 323/19; 307/252 B; 323/24

[51] Int. Cl.$^{2}$ .......................................... G05F 3/04

[58] Field of Search ........ 307/252 B, 252 N, 252 T, 307/252 UA, 296, 297; 323/16, 18, 19, 22 SC, 24, 38

[56] References Cited

UNITED STATES PATENTS

| | | | |
|---|---|---|---|
| 3,562,625 | 2/1971 | Broek | 323/24 X |
| 3,671,849 | 6/1972 | Kingston | 323/24 |
| 3,743,860 | 7/1973 | Rossell | 323/24 X |

*Primary Examiner*—A. D. Pellinen

*Attorney, Agent, or Firm*—Owen, Wickersham & Erickson

[57] ABSTRACT

A high gate current thyrister device is controlled by low current digital integrated MOS circuitry which samples alternating current supplied to the thyrister to detect zero voltage cross over points and converts each cross over point to a digital signal pulse which is then delayed until the ac waveform has passed beyond the zero voltage cross over point just far enough so that when the digital pulse is applied to the control gate of the thyrister self conduction thereof results while its duty cycle is maximized. Control of the thyrister duty cycle may be accomplished by delaying the digital control pulse for a predetermined time until the desired fractional amount of duty cycle to be omitted has elapsed, whereupon the delayed pulse is then applied to the control gate and produces self conduction of the thyrister.

15 Claims, 5 Drawing Figures

LOW POWER GATE SWITCHING DEVICE FOR TRIACS

BACKGROUND OF THE INVENTION

This invention relates to electronic control devices and more particularly to such a device and a method utilizing relatively low current for switching or firing triac and SCR devices in power circuits.

Triacs are commonly used as switching devices in electrical power systems because they can be controlled by a small current. However, low gate current triacs readily compatible with circuits implemented with integrated circuit semiconductor devices, particularly MOS devices, and capable of using inexpensive power supplies, were generally expensive and unreliable, particularly when used in high temperature environments. At high temperatures there was a tendency for prior low gate current triacs to fail or mis-trigger due to junction failure. High gate current triac devices were inherently more reliable. However, the problem was how to use them with MOS control devices because it was difficult to provide an MOS device that would withstand the high average current required to trigger a triac in a DC mode and particularly in circuits with multiple triac output stages. In the design of MOS devices, for reliability purposes, the width of a power supply line must be at least 1 mil wide for every 18 ma. of average current. With normal MOS processing the current variation can be easily 4 or 5 to 1 for a given device geometry and fabrication process. Thus, a triac output designed to guarantee 10.0 ma. minimum gate current could give up to 50 ma. of gate current. If five triac gate outputs were on a semiconductor chip, the worst case maximum current on a power line ($V_{BB}$) would be 250 ma., and therefore the power line would have to be 13.8 mils wide. For many MOS integrated circuit devices such a power line size could account for 10% or more of the entire device dimension. Thus, a serious problem prior to the present invention was to provide a means for triggering triacs at a lower average current so that MOS devices of efficient design could be used in their control circuit.

It is therefore a general object of the present invention to solve this problem by providing an improved circuit for triggering triacs.

Another object of the invention is to provide a means for triggering triacs that is particularly adaptable for direct implementation with MOS type integrated circuit devices.

Another object of the present invention is to provide a means for triggering a triac at its zero or near zero voltage point to thereby utilize the maximum power from the triac.

Yet another object of the present invention is to provide a means for providing incremental power control of a triac by locating the zero point on its current curve and thereafter initiating a control pulse at any desired intermediate point on the current curve between zero points of a cycle period.

A further object of the present invention is to provide a means for triggering triacs utilizing digital control circuitry.

BRIEF SUMMARY OF THE INVENTION

The aforesaid and other important objects of the invention are accomplished in general by generating a triac firing point control pulse that will reduce the average current used by the duty factor at which current is supplied. In the present method the zero crossings of the line or supply voltage are detected and current is only supplied for a small period of time at each zero crossing, thereby reducing the average current required. Where several triacs are used their firing times are staggered to further reduce the peak current required.

DETAILED DESCRIPTION OF A PREFERRED EMBODIMENT

Figure 3:
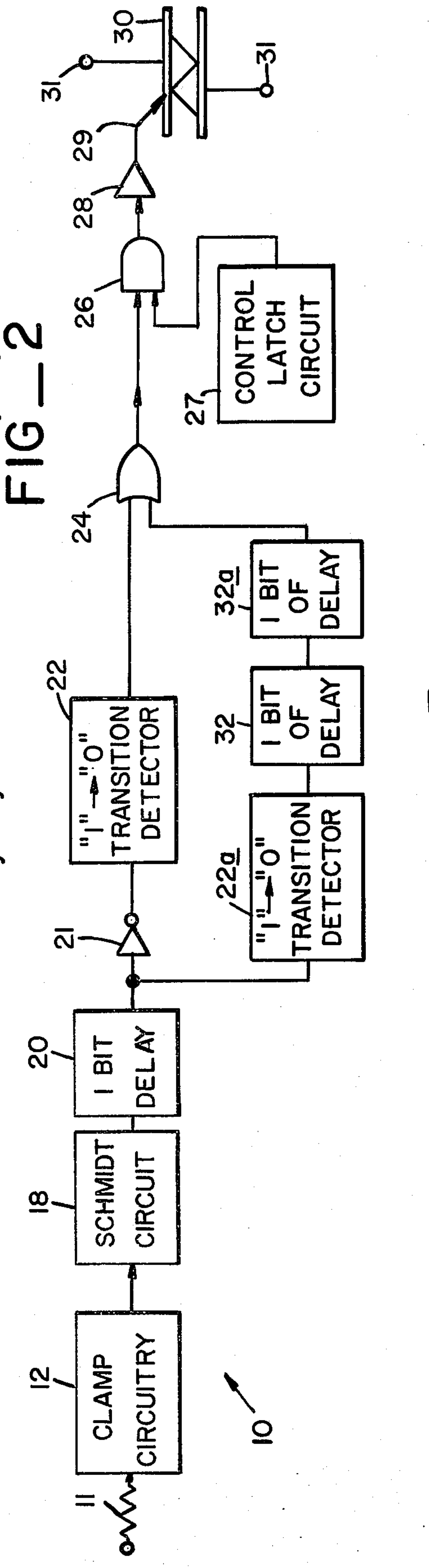
FIG. 3 is a block diagram of the circuit of the present invention.
Figure 1:
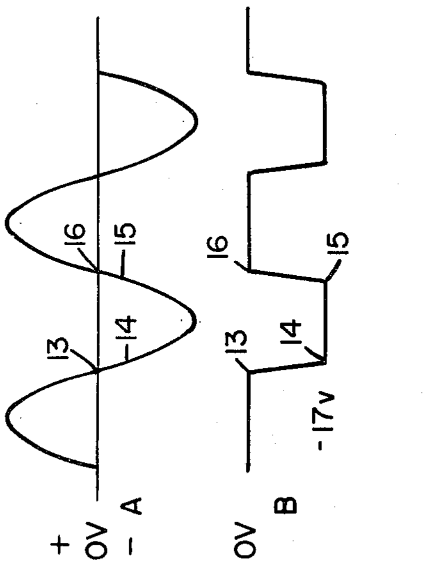
FIG. 1 is a diagram of two 60 hertz waveforms with waveform A representing a line voltage sine wave and with waveform B representing the pulse output of a clamp circuit.
Figures 4, 5:
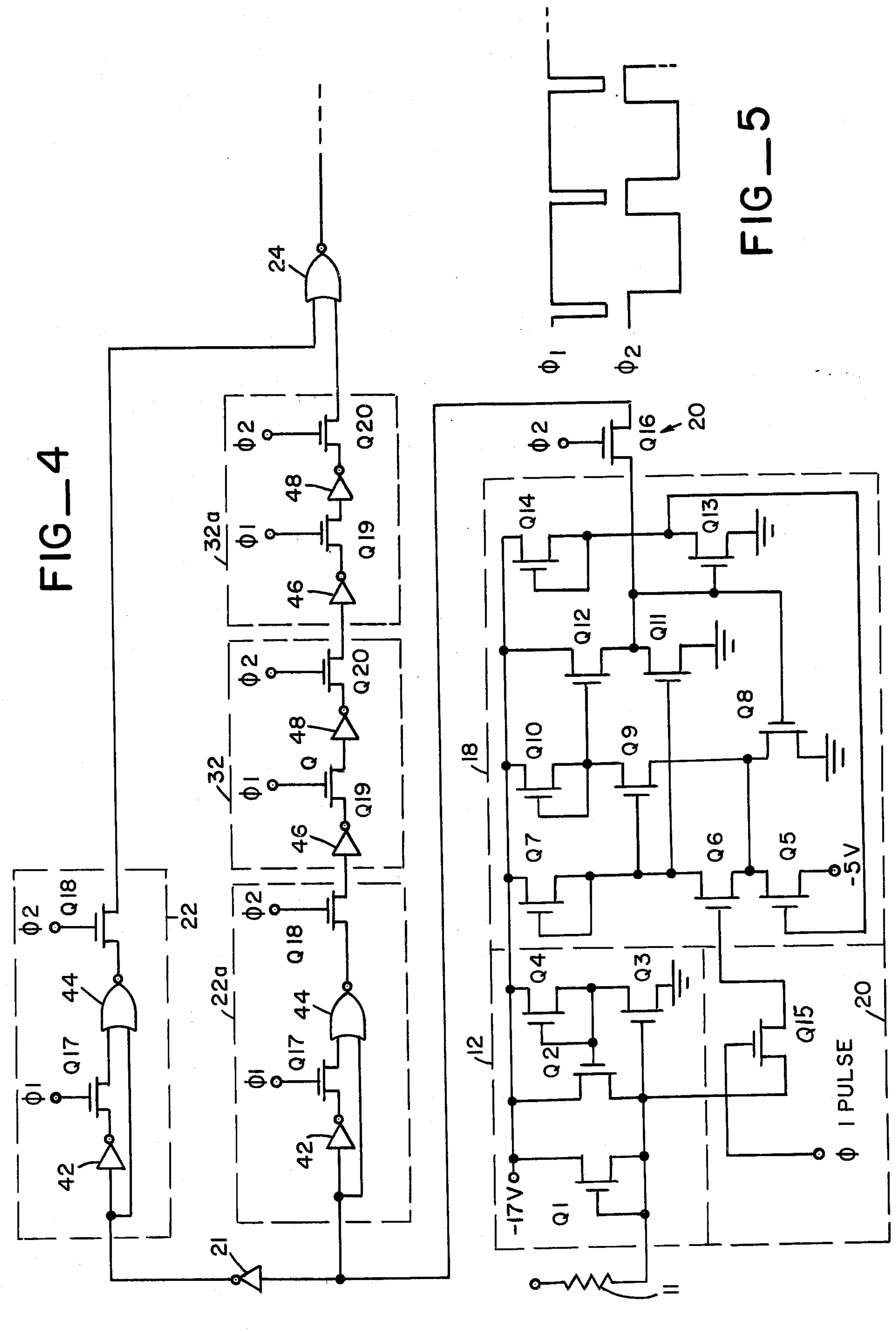
FIG. 4 is a partial schematic and partial block diagram of implementing circuitry of the present invention.
FIG. 5 is a diagram of two 10 kilohertz clock pulse trains shown in phase relationship.

A 60 hertz line voltage of 120 or 220 rms volts, shown as waveform A, FIG. 1, is supplied to a load through a triac switch 30, FIG. 3, and is also supplied as an input signal to the control circuit 10. A high value input resistor 11 serves to limit the amount of current supplied to a clamp circuit 12. The value of the resistor 11 is not critical, and is typically on the order of one megohm which has proven satisfactory in reducing the ac current which is passed to the clamp circuit 12. The clamp circuit 12 operates to establish a zero voltage or ground neutral reference point, which is indicated on the waveform drawings of the Figures as "O*v*". In the p-channel MOS circuitry of this preferred embodiment the clamp circuit 12 works only on the negative portion of the 60 hertz line voltage, as positive voltages would destroy the delicate circuitry. When the 60 hertz line voltage passes from positive to negative and begins its negative half cycle as indicated by reference numeral 13, waveform A, FIG. 1, the clamp circuit 12 begins to conduct and follows the negative going waveform until a predetermined voltage is reached, shown as reference numeral 14 waveform A, FIG. 1, at which point and thereafter the voltage is clamped to the predetermined value which in the embodiment shown is −17 volts. When the 60 hertz line voltage has about completed its negative half cycle and is approaching the O*v* reference point, the clamp circuit begins to follow the wave form just as soon as it equals the clamp voltage, as indicated by reference numeral 15, waveform A, FIG. 1. The clamp circuit 12 continues to follow the waveform until it reaches the zero voltage reference point, reference numeral 16, whereupon the clamp maintains the voltage at zero volts until the next negative half cycle commences. The output waveform of the clamp curcuit 12 is illustrated by waveform B, FIG. 1, and is shown in time sequence with waveform A. The clamp circuit 12 can be implemented in many ways using diodes and transistors or it can be built using MOS integrated circuitry as shown in FIG. 4.

After the line voltage waveform has been clamped it is then desirable to improve the rise time of the 60 hertz pulse of waveform B, and this is accomplished by passing the 60 hertz pulse to a Schmidt circuit 18. The Schmidt circuit 18 will give a faster rise time to the waveform edge which is desirable for use with digital circuits, and is implemented in this preferred embodiment of the present invention by the circuitry of FIG. 4.

The one bit delay circuit 20 functions to relate the timing of the 60 hertz pulse generated by the clamp circuit to a basic clock frequency of the digital circuitry. In the embodiment shown a digital clock (not shown) is generating two phase alternating current pulses at the rate of 10,000 hertz (10 kHz). The pulses are of two different kinds. One set of 10 kHz pulses is called phase 1 and is represented by waveform $\phi$ 1 of FIG. 5, while the other set of 10 kHz pulses is called phase 2 being waveform $\phi$ 2 of FIG. 5. The two waveforms of FIG. 5 maintain a phase relationship as is shown therein. The 10 kHz clock frequency is not in synchronization with the 60 Hz line voltage so it becomes necessary to convert the 60 Hz waveform into a clocked pulse compatible with digital circuitry being driven by the two phase 10 kilohertz clock.

When the 60 Hz line voltage has passed through zero from positive to negative as shown at 13, in FIG. 1, and has caused the Schmidt circuit 18 to shape the pulse with a sharp leading edge, the next available-in-time phase one 10 kHz pulse permits the 60 hertz pulse of waveform B to pass into the one bit delay circuit 20 wherein it is stored. The next available-in-time phase two 10 kHz pulse is applied to the one bit delay circuit 20 to retrieve the stored pulse and pass it to subsequent circuitry to be described hereinafter. The elapsed time from the entry of the pulse from the Schmidt circuit into the one bit delay circuit 20 and the retrieval of the pulse is defined as one bit of delay, one bit being equivalent to 100 micro-seconds in this example.

The transition of the clamp circuit 60 hertz pulse from the zero reference point 13 to the −17 volt point 14 is defined in computer logic terminology as a zero to one (0–1) transition. Conversely, the later transition of the pulse from the −17 volt point 15 to the zero reference point 16 is defined in logic as a one to zero (1–0) transition.

When the 60 hertz pulse is retrieved from the one bit delay circuit 20 by the next-in-time phase two pulse, the signal is sent to an inverter 21 which reverses the logic definition of the signal. For example when the 60 hertz pulse is going from the zero to one transition, the inverter 21 inverts that transition to become a one to zero transition. Then this one to zero transition signal is connected to a one to zero transition detector 22 which thereupon produces a one bit pulse.

The one bit pulse from the transition detector 22 is applied to an "or" gate 24 and thence to an "and" gate 26. A control latch circuit 27 is also connected to the input of the "and" gate 26 and serves to interface a digital control signal from external digital circuitry with the one bit pulse so that a controlled triac 30 will be turned on only when the digital control signal and the one bit pulse are applied to the "and" gate 26 at the same time. When that condition obtains, the one bit pulse is passed by the "and" gate 26 to an amplifier 28 where its voltage level is increased a sufficient amount to trigger the triac 30 into self sustaining conduction. The actual amount of voltage increase supplied by the amplifier 28 will depend upon the forward breakover voltage characteristics of the triac 30 chosen to be used with the present invention.

Referring again to the one bit delay circuit 20 it is essential to the proper functioning of the circuitry of the present invention that the triac control pulse be delayed at lease one bit (100 usec) before being applied to the triac so that the 60 hertz waveform applied to the anodes 31 of the triac will have crossed the zero reference point and the developing voltage and current are sufficient to hold the triac in self conduction after the trigger pulse is applied.

Figure 2:
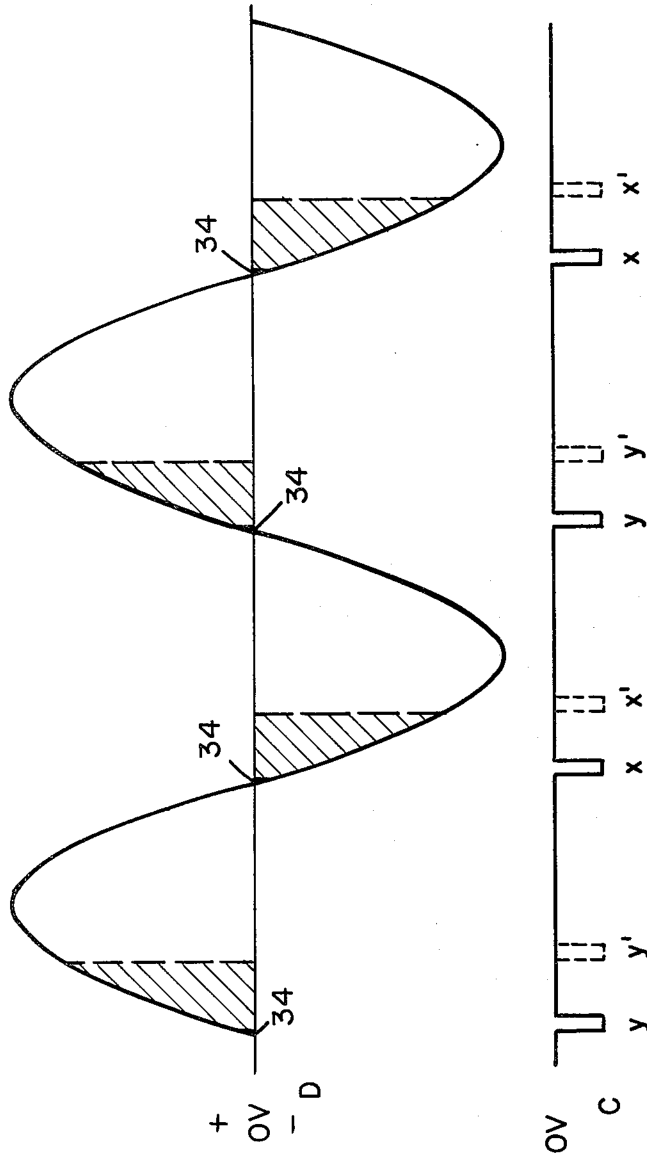
FIG. 2 is a diagram of two 60 hertz waveforms with waveform C representing triac trigger control pulses and with waveform D representing the output of the triac as controlled by the circuit of the present invention.

Summarizing the operation of the circuitry thus far, when a zero to one transition is sent from the one bit delay 20, the inverter 21 caused the one to zero transition detector 22 to put out a one bit (100 microsecond) pulse which is then selected through the "or" gate 24, the "and" gate 26 and the amplifier 28 before being applied to the gate 29 of the triac 30. This pulse is shown as pulse *x* on waveform C of FIG. 2. Waveform D, FIG. 2, represents the output waveform of the triac 30 and is shown in time and phase relationship with waveform C. As can be seen, pulse *x* triggers the triac 30 into conduction only on the negative going portion of the 60 hertz line voltage. For the other half of the line voltage waveform different circuitry is required and will now be described.

Again referring to the one bit delay circuit 20 the output thereof is also supplied directly to the input of a second one to zero transition detector 22*a*. At the end of the negative half cycle of the 60 hertz waveform, reference numeral 15, FIG. 1, a one to zero transition occurs, and this transition produces another one bit pulse in the second transition detector 22*a*. The function of the pulse from the second detector 22*a*, shown as pulse *y* of waveform C, FIG. 2, is to trigger the triac 30 into conduction on the positive going half cycles of the 60 hertz waveform. Yet, the second detector 22*a* actually produces the pulse before the zero reference point is reached by the hertz waveform. Thus, it becomes necessary to dealy the second detector 22*a* pulse for a sufficient time so that the waveform will have crossed the zero reference point in its positive going transition before the control pulse is applied to trigger the triac 30 into self conduction. To implement the minimum required delay, two identical one bit delay circuits, 32 and 32*a* have been found sufficient and are connected in series to the output of the second one to zero transition detector 22*a*. The number of bits of delay required depends on the clock frequency but will approximate 200 microseconds.

After the two bit delay the *y* pulse is passed through the "or" gate 24 and the "and" gate 26 and is then amplified in the same manner as the first pulse by the amplifier 28 before being applied to the gate 29 of the triac 30. Thus, pulse *y* of waveform C, FIG. 2, is shown to initiate the positive half cycle of the 60 hertz output of the triac 30 as shown by waveform D, FIG. 2.

Waveform D is not a perfect sinewave because of the minute distortions occurring at each zero reference crossing point. These distortions 34 are inherently produced when the control pulses *x* and *y* are delayed until the waveform has reached a voltage amplitude sufficient to assure self conduction in the triac 30. Yet, as can be seen in waveform D, the distortions 34 are virtually negligible insofar as reduction of the triac duty cycle is concerned.

If in a particular application controlled reduction of the triac duty cycle is desired, then it is possible to modify the circuit 10 to add a delay circuit at the output of the one bit delay circuit 20. The delay circuit could be a series of one bit delays 32, implemented as shift registers 32 and 32*a*, FIG. 4, and the actual amount of delay could be determined using well known digital counting and switching techniques. The effect of such a delay circuit has been shown on waveforms C and D with broken lines. Delayed pulses *x'* and *y'* trigger the triac 30 into self conduction after about a third of the total duty cycle (shown as the shaded portion of waveform D, FIG. 2) has elapsed without triac conduction. In this way the triac 30 is conducting for two thirds of the total duty cycle and there is a power reduction of one third. Thus, power control for electric machinery or heater elements is easily accomplished by delaying the control pulses by the duty cycle fractional equivalent of the desired power reduction.

The implementation of the control circuit may be accomplished utilizing well known large scale integrated circuit techniques of the metal-oxide-silicon (MOS) art. A typical circuit is shown in partial schematic and partial diagrammatic form in FIG. 4.

The isolation resistor 11 is connected to the clamp circuit 12 comprising transistors Q 1 through Q 4. The Schmidt circuit 18 is made up of transistors Q 5 through Q 14. The one bit delay circuit 20 is made up of transistors Q 15 and Q 16. The one to zero transition detectors 22 and 22*a* are identical and comprise an inverter 42, an "or" gate 44 and two transistors Q 17 and Q 18. An inverter 21 is interposed in the signal path to the first detector 22. The one bit delay circuits 32 and 32*a* following the second generator 30 are well known shift registers employing two inverters 46 and 48 and two transistors Q 19 and Q 20. Transistors Q 15, Q 17 and Q 19 are controlled by phase one ($\phi$ 1) clock pulses whereas transistors Q 16, Q 18 and Q 20 are controlled by phase two ($\phi$ 2) clock pulses in accordance with the well established principles of dynamic two phase MOS digital circuitry.

A delay circuit useful for controlling the duty cycle of the triac may be comprised of a series of shift registers of the type employed in the one bit delay shift register 32 and 32*a*. FIG. 4 within dashed block 20 label the sole transistor Q15 of the control circuit. Also, if the clock frequency is increased above 10 kilohertz, it would be necessary to add one or more one bit delay circuits in series at the output of the second one bit delay shift register 32*a*, so that a 200 microsecond delay is preserved in the *y* pulse which has been found necessary for circuit operability.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A low power method for triggering an electronic semiconductor thyrister device used as a switch in a generally sinusoidal alternating current circuit comprising the steps of:

a. generating two series of in-phase digital clock pulses having a period of one bit which is much shorter than the period of said alternating current and not necessarily synchronized therewith;
b. clamping a sample of said alternating current to a zero reference voltage and to a low direct current voltage compatible with low power solid state digital circuitry to produce a generally trapezoidal waveform having the period of said alternating current;
c. shaping said trapezoidal waveform into generally a square wave having the same period of said alternating current;
d. selecting a next-in-time one bit digital clock pulse each time said square wave has gone through a voltage amplitude transition;
e. delaying said one bit digital clock pulse until said alternating current has passed through a zero voltage reference point and is of sufficient voltage amplitude to sustain said thyrister device in a conduction mode; and
f. applying said delayed one bit digital clock pulse to a control gate of said thyrister device whereby said device is triggered into self sustaining conduction.

2. The method of claim 1 additionally comprising the step of amplifying said delayed one bit digital control pulse to match the forward breakover voltage characteristic of said thyrister device so as to trigger it into self sustaining conduction.

3. The method of claim 2 wherein said two series of in-phase digital clock pulses have a one bit period of approximately 100 microseconds and said alternating current has a frequency of generally 60 hertz.

4. The method of claim 3 wherein said one bit digital clock pulse is delayed for a minimum of one bit incident to a transition of said square wave from the zero reference voltage to the low direct current voltage and is delayed for a minimum of three bits incident to a transition of said square wave from the low direct current voltage to the zero reference voltage.

5. The method of claim 4 comprising the additional step of further delaying said one bit digital clock pulse for a predetermined fractional amount of the period of said alternating current, said fraction always being no greater than one half, whereby the duty cycle of said thyrister device may be regulated.

6. The method of claim 4 for triggering a triac.

7. The method of claim 5 for triggering a triac.

8. A low power solid state clocked digital control circuit for triggering an electronic semiconductor thyrister device used as a switch in a generally sinusoidal alternating current circuit comprising:

a. a clamp circuit connected to said alternating current and adapted to limit a sample thereof between a zero reference voltage and a low direct current voltage compatible with said clamp circuit, the output thereof resulting in a generally trapezoidal waveform having the period of said alternating current;
b. waveform shaping circuit means connected to said clamp circuit for shaping said trapezoidal waveform into generally a square wave having the same period of said alternating current;
c. digital clock means connected to said control circuit and generating clock pulses having a period of one bit which is shorter than the period of said alternating current and not necessarily synchronized therewith;

d. a detector circuit connected to said clock and to the output of said waveform shaping circuit and adapted to select a next-in-time one bit clock pulse each time said square wave has gone through a voltage amplitude transition;

e. storage circuitry connected to said detector circuit and said clock means and adapted to delay said one bit pulse until said alternating current has passed through a zero voltage reference point and is of sufficient voltage amplitude to sustain said thyrister device in a conduction mode;

f. a gate on said thyrister device connected to said storage circuitry to receive said delayed one bit pulse.

9. The circuitry of claim 8 additionally comprising an amplifier circuit connected between said storage circuitry and said thyrister device gate and adapted to increase the amplitude of said one bit pulse to match the forward breakover characteristic of said one bit pulse to trigger said thyrister device into self sustaining conduction.

10. The circuitry of claim 8 adapted for a 60 hertz alternating current and wherein the clock means generates clock pulses at a frequency of approximately 10 kilohertz.

11. The circuitry of claim 9 additionally comprising a digitally controlled delay circuit interconnected with said storage circuitry and adapted to further delay said one bit pulse for a predetermined fractional amount of the period of said alternating current, said fraction always being no greater than one half, whereby the duty cycle of said thyrister device may be regulated.

12. The control circuit of claim 11 wherein said circuitry is implemented with large scale integrated two phase dynamic MOS semiconductor devices and said clock means generates two series of in-phase clock pulses with each series having a different average power and the same period, and said trapezoidal waveform shaping means is a Schmidt circuit, and said storage circuitry and delay circuit are made up of a predetermined number of interconnected controlled two phase one bit MOS shift registers.

13. The control circuit of claim 11 adapted for use with a triac.

14. In a two phase dynamic p-channel MOS large scale integrated semiconductor device, a low power clocked digital gate control circuit for triggering the self conduction of a triac used as a switch in a generally 60 hertz sinusoidal alternating current circuit comprising:

a clamp circuit connected to said alternating current and having an output in the form of a trapezoid of the period of said alternating current and an amplitude generally from zero reference point being a zero state to a fixed predetermined minus being a one state;

a Schmidt circuit connected to the output of said clamp circuit and adapted to convert said trapezoidal waveform into a generally square wave;

a clock pulse source having an output of two phase in time digital clock pulses of a period of generally 100 microseconds, said period being equivalent to one bit;

a first one bit delay circuit connected to the output of said Schmidt circuit and to said clock pulse source whereby the said square wave is delayed in time for the period of one bit;

a digital inverter connected to the output of said one bit delay circuit and adapted to invert said square wave;

a first one-to-zero transition detector connected to the output of said inverter and to said clock source and adapted to output a one bit trigger pulse when a one to zero transition occurs in said inverted square wave;

a digital logic "or" gate circuit having one of two inputs connected to the output of said first one-to-zero transition detector and having an output;

a digital logic "and" gate circuit having one of two inputs connected to the output of said "or" gate and having an output;

a digital control latch circuit connected to the second input of said "and" gate and to external digital control circuitry and adapted to pass clock pulses when triac triggering is intended;

an amplifier connected between the output of said "and" gate and the gate of said triac and adapted to amplify said trigger pulse to a sufficient amplitude to trigger said triac into self sustaining conduction;

a second one-to-zero transition detector connected to the output of said first one bit delay circuit and to said clock source and adapted to output a one bit trigger pulse when a one-to-zero transition occurs in said square wave;

a second one bit delay circuit connected to the output of said second one-to-zero transition detector and to said clock source and adapted to delay the output pulse from said second detector by a period of one bit; and a third one bit delay circuit connected to the output of said second one bit delay circuit and to said clock source and adapted to delay said delayed pulse from said second delay circuit by a period of one bit and having an output connected to the second input of said "or" gate.

15. The circuit of claim 13 additionally comprising a programmable series of shift register circuits connected to the clock source and to said control circuit and adapted to delay said trigger pulses for a variable predetermined fraction of the period of said 60 hertz alternating current, whereby the duty cycle of said triac may be controlled.

* * * * *